United States Patent [19]
Lee et al.

[11] Patent Number: 6,107,140
[45] Date of Patent: Aug. 22, 2000

[54] METHOD OF PATTERNING GATE ELECTRODE CONDUCTOR WITH ULTRA-THIN GATE OXIDE

[75] Inventors: Yong Meng Lee; Yunqiang Zhang, both of Singapore, Singapore

[73] Assignee: Chartered Semiconductor Manufacturing Ltd., Singapore, Singapore

[21] Appl. No.: 09/467,131

[22] Filed: Dec. 20, 1999

[51] Int. Cl.[7] .................................................. H01L 21/336
[52] U.S. Cl. .......................... 438/259; 438/265; 438/197; 438/585; 257/288; 257/332
[58] Field of Search .................... 438/584–585, 438/597, 684, 621, 631, 633, 637, 151, 647, 197, 259, 265, 942; 257/288, 332, 412

[56] References Cited

U.S. PATENT DOCUMENTS

| | | | |
|---|---|---|---|
| 5,489,543 | 2/1996 | Hong | 437/41 |
| 5,543,343 | 8/1996 | Bryant et al. | 437/51 |
| 5,682,055 | 10/1997 | Huang et al. | 257/408 |
| 5,786,255 | 7/1998 | Yeh et al. | 438/299 |
| 5,858,848 | 1/1999 | Gardner et al. | 438/305 |
| 5,915,181 | 6/1999 | Tseng | 438/289 |
| 5,915,183 | 6/1999 | Gambino et al. | 438/300 |
| 5,960,298 | 9/1999 | Kim | 438/424 |
| 6,015,755 | 1/2000 | Chen et al. | 438/692 |

*Primary Examiner*—Matthew Smith
*Assistant Examiner*—Robert Hollinger
*Attorney, Agent, or Firm*—George O. Saile; Rosemary L. S. Pike; Stephen G. Stanton

[57] ABSTRACT

A method of patterning a gate electrode comprising the following steps. A semiconductor structure, with an upper silicon layer, and having an active area is provided. A sacrificial oxide layer overlies the semiconductor structure, a first polysilicon layer overlies the sacrificial silicon oxide layer, and a silicon nitride layer overlies the polysilicon layer. The nitride, first poly, and sacrificial oxide layers are patterned to form a gate conductor opening within the active area. A gate oxide layer is grown over the semiconductor structure within the gate conductor opening an oxide sidewall spacers are grown on the first polysilicon sidewalls. A second polysilicon layer is deposited over the structure, filling the gate conductor opening. The second polysilicon layer is polished to remove the excess of the second polysilicon layer from the nitride layer, forming a polysilicon gate conductor within the gate conductor opening and over the gate oxide layer. The polysilicon gate conductor has an exposed upper surface that is oxidized to form a hard mask oxide layer over the polysilicon gate conductor. The nitride layer is etched and removed from the first polysilicon layer. The first polysilicon layer is etched and removed. The oxide sidewalls and hard mask are removed.

32 Claims, 4 Drawing Sheets

METHOD OF PATTERNING GATE ELECTRODE CONDUCTOR WITH ULTRA-THIN GATE OXIDE

BACKGROUND OF THE INVENTION

The current practice for defining poly (polysilicon) gate electrodes involves the patterning of the gate through photolithography followed by an anisotropic poly etch which stops on the gate oxide, i.e. the gate oxide acts as an etch stop. However, it has become increasingly difficult to endpoint the poly etch on the gate oxide without trenching into the underlying silicon substrate as the gate oxide gets increasingly thinner. Poly edge gate oxide integrity (GOI) may become a problem if micro-trenching occurs at the poly edge.

U.S. Pat. No. 5,915,181 to Tseng describes a method of fabricating a deep submicron MOSFET (metal oxide semiconductor field effect transistor) device having a local threshold voltage adjust region in a semiconductor substrate that is self-aligned to an overlying inverse polysilicon gate structure.

U.S. Pat. No. 5,489,543 to Hong describes a method of fabricating a MOS device having a localized anti-punchthrough region that is adjacent to, but does not contact, source/drain regions. A channel ion implantation (I/I) to form the anti-punchthrough region and an inverse polysilicon gate is formed.

U.S. Pat. No. 5,786,255 to Yeh et al. describes a method of forming MOS components in that after an inverse gate and doped source/drain regions are formed, a polysilicon layer is deposited and planarized by chemical-mechanical polishing (CMP). The resulting unremoved CMP'ed poly layer acts as source/drain terminals.

U.S. Pat. No. 5,858,848 to Gardner et al. describes a method for forming nitride sidewall spacers self-aligned between opposed sidewall surfaces of an inverse gate conductor and a sacrificial dielectric sidewall.

U.S. Pat. No. 5,915,183 to Gambino et al. describes a process for forming raised source/drain junctions using chemical mechanical polishing (CMP) combined with a recess etch of blanket polysilicon. The raised source/drains are defined by salicide gate conductors and raised shallow isolation trench regions (STI).

SUMMARY OF THE INVENTION

Accordingly, it is an object of the present invention to provide a method of patterning gate electrodes having ultra-thin gate oxides.

Another object of the present invention is to provide a method of patterning gate electrodes by reducing the plasma damage experienced by the gate oxide by using a poly chemical-mechanical polish (CMP) and a shorter duration poly plasma etch.

Yet another object of the present invention is to provide a method of patterning gate electrodes that reduces the danger of poly edge GOI failure due to nitride sublimation (Kooi effect).

A further object of the present invention is to provide a method of patterning gate electrodes while improving the poly gate conductor profile through a controlled poly etch using an oxide hard mask.

An additional object of the present invention is to provide a method of patterning gate electrodes that reduces the danger of poly edge GOI (gate oxide integrity) failure by protecting the bottom poly edges with oxide during the controlled poly etch.

Other objects will appear hereinafter.

It has now been discovered that the above and other objects of the present invention may be accomplished in the following manner. Specifically, a semiconductor structure, with an upper silicon layer, and having an active area is provided. A sacrificial oxide layer overlies the semiconductor structure, a first polysilicon layer overlies the sacrificial silicon oxide layer, and a silicon nitride layer overlies the polysilicon layer. The nitride, first poly, and sacrificial oxide layers are patterned to form a gate conductor opening within the active area. The semiconductor structure within the gate conductor opening may be cleaned and a gate oxide layer is then grown over the cleaned semiconductor structure and the exposed first poly (side wall). A second polysilicon layer is deposited over the structure, filling the gate conductor opening. The second poly layer is polished to remove the excess of the second poly layer from the nitride layer, forming a polysilicon gate conductor within the gate conductor opening and over the gate oxide layer. The poly gate conductor has an exposed upper surface that is oxidized to form an hard mask oxide layer over the poly gate conductor. The nitride layer is etched and removed from the first poly layer. The first poly layer is etched and removed from the semiconductor structure exposing the side walls of the poly gate conductor. The hard mask oxide layer may be etched and removed from the poly gate conductor to expose the upper surface of the poly gate conductor. The bottom edges of the poly gate are protected during this etching process by the oxidized first poly side wall. The exposed upper surface and side walls of said poly gate conductor may then be oxidized.

BRIEF DESCRIPTION OF THE DRAWINGS

The features and advantages of the method of patterning gate electrodes having ultra-thin gate oxides according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
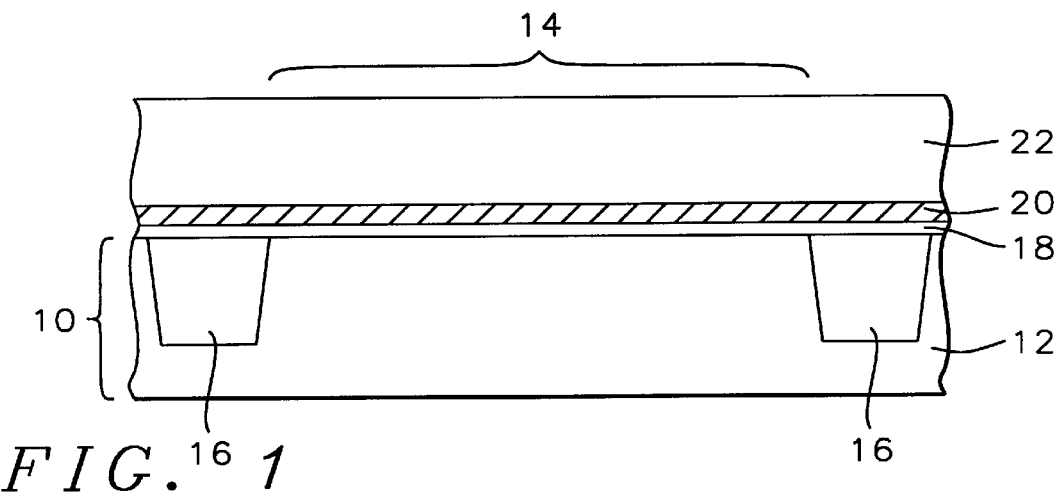
FIGS. 1 through 10 schematically illustrate in cross-sectional representation a preferred embodiment of the present invention.

Accordingly as shown in FIG. 1, starting semiconductor structure 10 includes an upper silicon (Si) layer 12. The structure is understood to possibly include a semiconductor wafer, substrate or SiO substrate, active and passive devices formed within the wafer. The upper silicon layer 12 can be the top surface region of a Si wafer.

Active area 14 within semiconductor structure 10 may be defined by shallow trench isolation (STI) regions 16.

Sacrificial silicon oxide ($SiO_2$) layer 18 is formed over silicon layer 12 to a thickness of about 135 to 165 Å, more preferably 145 to 155 Å, and most preferably about 150 Å.

First polysilicon layer 20 is formed over sacrificial oxide layer 18 to a thickness of about 180 to 220 Å, more preferably 190 to 210 Å, and most preferably about 200 Å.

Silicon nitride ($Si_3N_4$) layer 22 is formed over first polysilicon layer 20 to a thickness of about 2070 to 2530 Å, more preferably 2200 to 2530 Å, and most preferably about 2300 Å.

Figure 2:
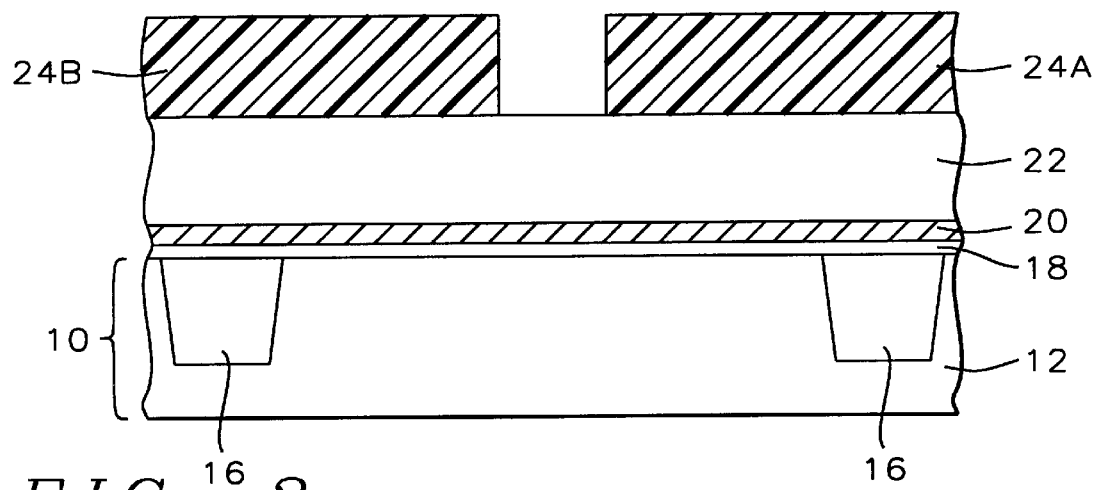

As shown in FIG. 2, photoresist layer 24 is formed over nitride layer 22 and patterned into portions 22A, 22B as a reverse gate mask.

Figure 3:
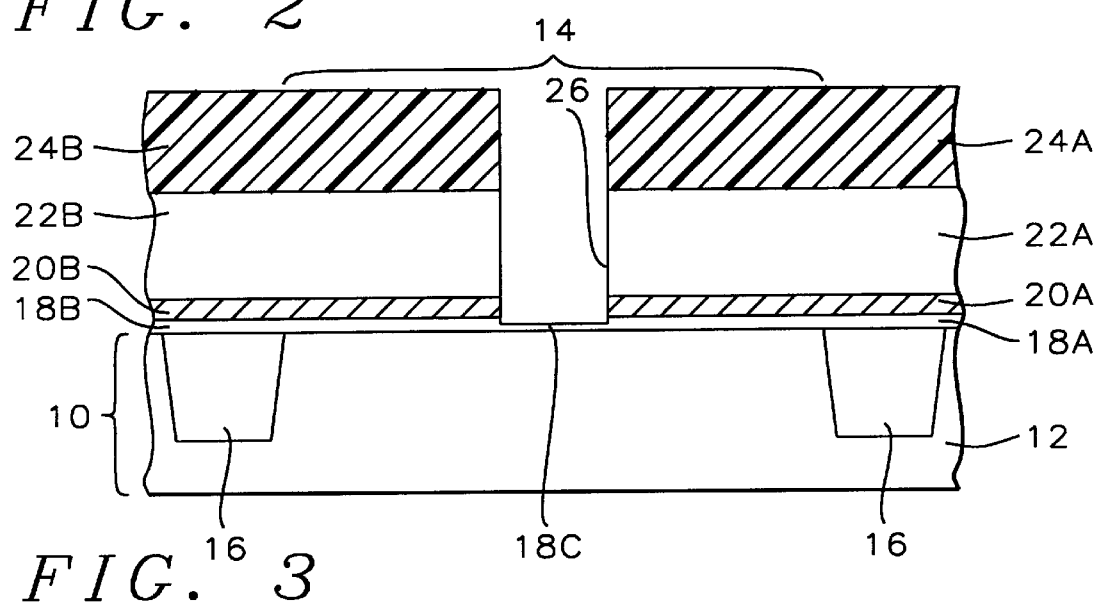

As shown in FIG. 3, nitride layer 22, poly layer 20, and sacrificial oxide layer 18 are patterned, preferably by an anisotropic nitride/poly etch selective to the underlying sacrificial oxide layer 18, to form gate conductor opening 26 within active area 14. Nitride layer 22, poly layer 20 and sacrificial oxide layer 18 are split into portions 22A, 22B; 20A, 20B; and 18A, 18B, respectively. A small portion of sacrificial oxide layer 18 at 18C may remain within gate conductor opening 26, connecting sacrificial oxide layer portions 18A, 18B.

Since sacrificial oxide layer 18 is relatively thick to gate oxide layer 28 to be formed, there is a sufficient margin of error for an over-etch of nitride layer 22, poly layer 20, and sacrificial oxide layer 18.

Figure 4:
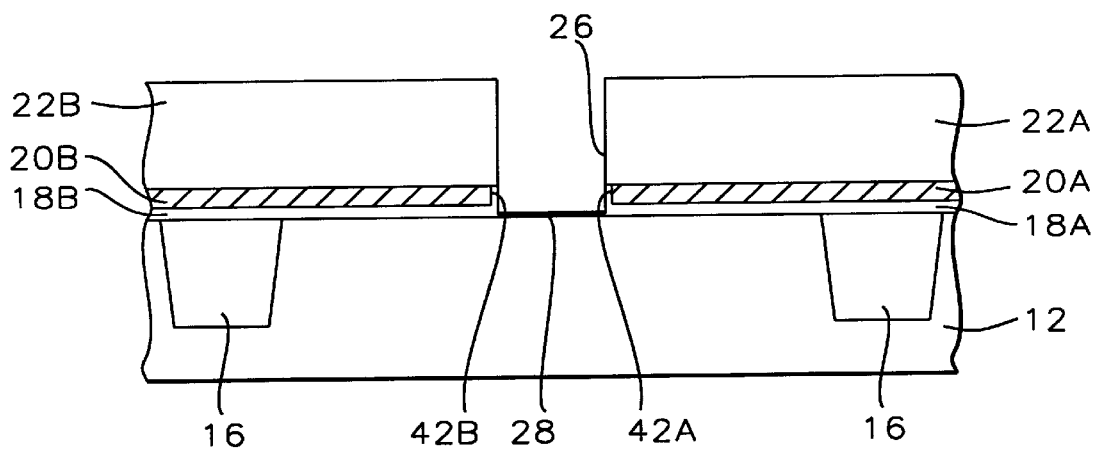

As shown in FIG. 4, photoresist layer portions 24A, 24B are stripped and removed.

Semiconductor structure 12 within gate conductor opening 26 is cleaned to prepare its surface for growth of ultra-thin gate oxide 28. This cleaning will also remove any remaining sacrificial oxide layer at 18C. The clean is preferably an isotropic HF clean.

Gate oxide layer 28 is then formed (e.g., grown or deposited) over exposed semiconductor structure 12 within gate conductor opening 26 and between sacrificial oxide layer portions 18A, 18B. Gate oxide layer 28 is from about 10 to 30 Å thick, more preferably from about 15 to 25 Å thick, and most preferably about 20 Å thick.

Also, gate oxide layer 28 is formed on the exposed sidewalls of the poly layer 20 to form oxide sidewalls (spacers) 42A, 42B on the exposed sidewalls of poly layer 20 portion 20A, 20B.

The presence of sacrificial oxide layer 18 serves not only as an etch stop for the etching step of nitride and poly layers 22, 20, respectively, to form gate conductor opening 26, but also cushions the stress in the silicon layer 12 of semiconductor structure 10 during gate oxide layer 28 formation. This is important in ensuring consistent gate oxide layer 28 uniformity and quality, or gate oxide integrity (GOI), at the edge of the to be formed poly gate electrode conductor 32.

First poly layer 20 and portions 20A, 20B also act as a buffer against nitride sublimation into the silicon layer 12 causing formation of silicon oxy-nitride (SiON) spots or ribbons, known as the Kooi effect, of semiconductor structure 10. The Kooi effect (also known as the white-ribbon or black-belt effect) may cause localized gate oxide layer 28 thinning near the edges of poly portions 20A, 20B where SiON spots or ribbons have formed. This causes gate oxide non-uniformity, low-voltage breakdown and reliability problems with the gate oxide.

Figure 5:
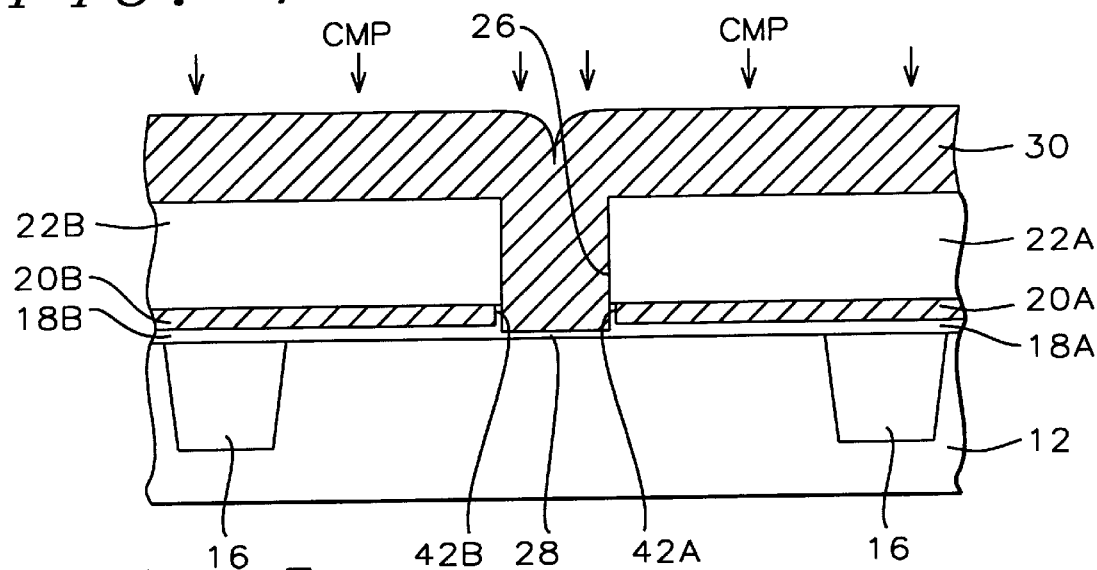

As shown in FIG. 5, second polysilicon layer 30 is deposited over the structure, filling gate conductor opening 26 over gate oxide layer 28. Second poly layer 30 is deposited to a thickness from about 3150 to 3850 Å, more preferably from about 3400 to 3600 Å, and most preferably 3500 Å above nitride layer portions 22A, 22B.

Figure 6:
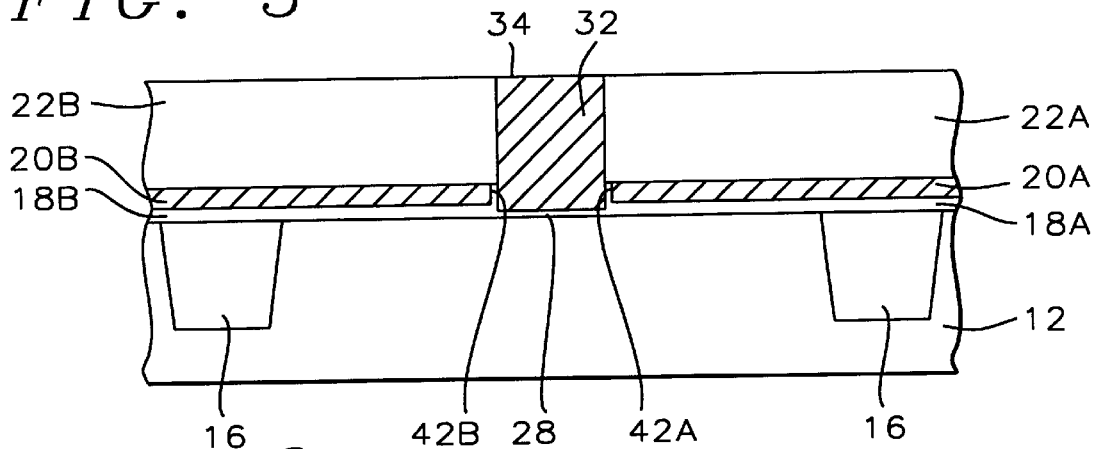

As shown in FIG. 6, second poly layer 30 is then selectively polished down, preferably by chemical-mechanical polishing (CMP), to remove the excess second poly layer 30 from nitride layer portions 22A, 22B forming gate electrode conductor 32. Gate electrode conductor 32 has an upper exposed surface 34. The CMP of second poly layer 30 may be accomplished with or without a reverse mask.

Figure 7:
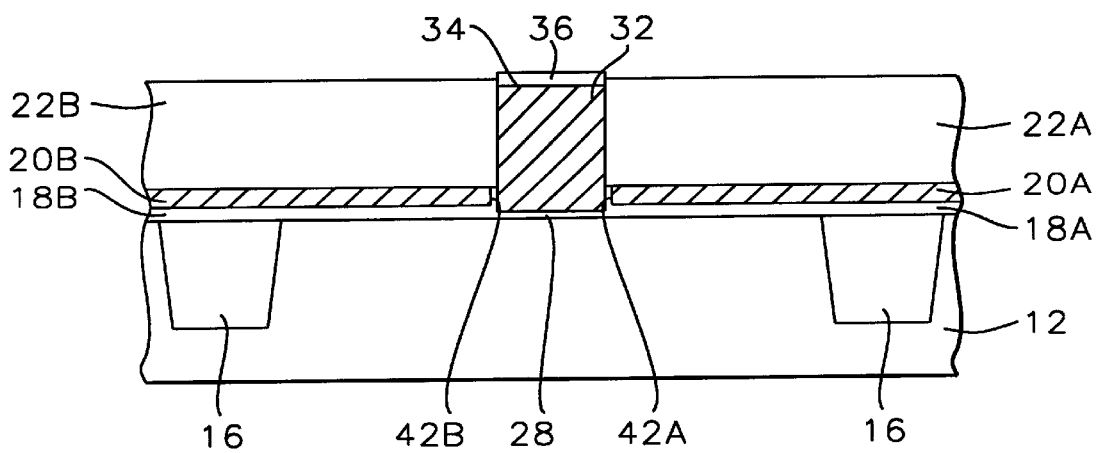

As shown in FIG. 7, upper surface 34 of gate electrode conductor 32 is re-oxidized to form hard mask silicon oxide layer 36 over gate electrode conductor 32. Hard mask oxide layer 36 is preferably from about 180 to 550 Å thick, more preferably from about 250 to 450 Å thick, and most preferably from about 300 to 350 Å thick.

Figure 8:
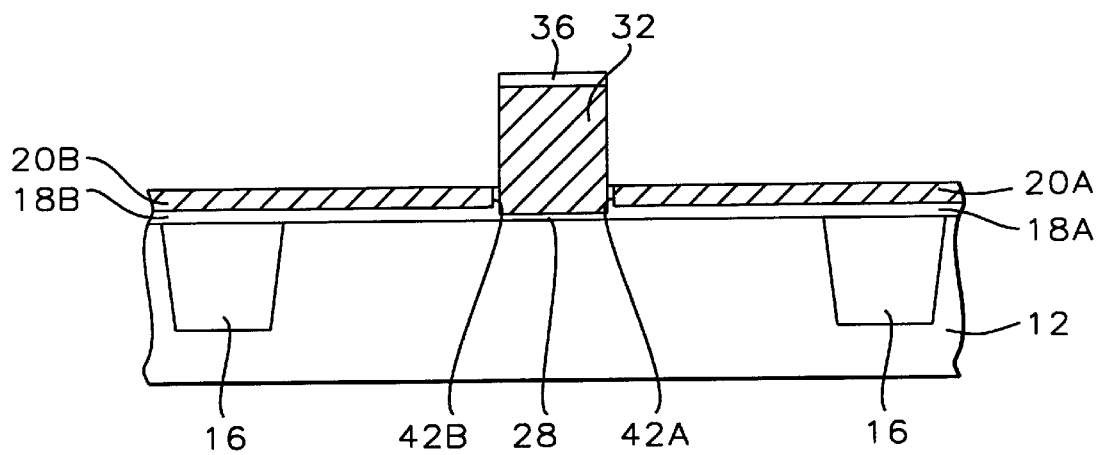

As shown in FIG. 8, nitride layer portions 22A, 22B are selectively etched and removed, preferably by an isotropic phosphoric acid wet etch, exposing first poly layer portions 20A, 20B.

Figure 9:
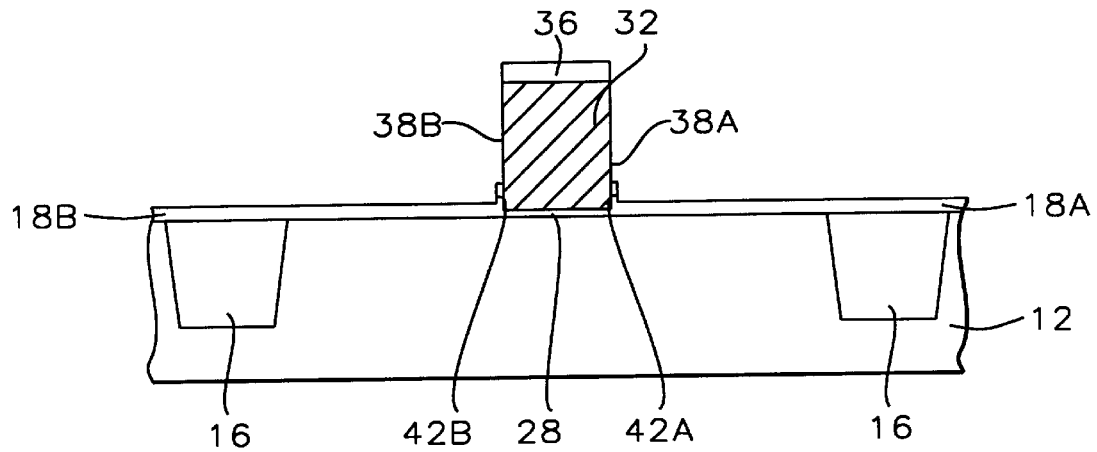

As shown in FIG. 9, a short polysilicon plasma etch is carried out using oxide layer 36 over gate electrode conductor 32 as an oxide hard mask.

This serves to not only etch and remove first poly layer portions 20A, 20B, but also to straighten-up polysilicon gate electrode conductor side walls' 38A, 38B profile. Oxide sidewalls 42A, 42B protect the lower portions of polysilicon gate electrode side walls 38A, 38B from the plasma etch, thus reducing the danger of polysilicon gate electrode edge/side wall GOI (gate oxide integrity).

Figure 10:
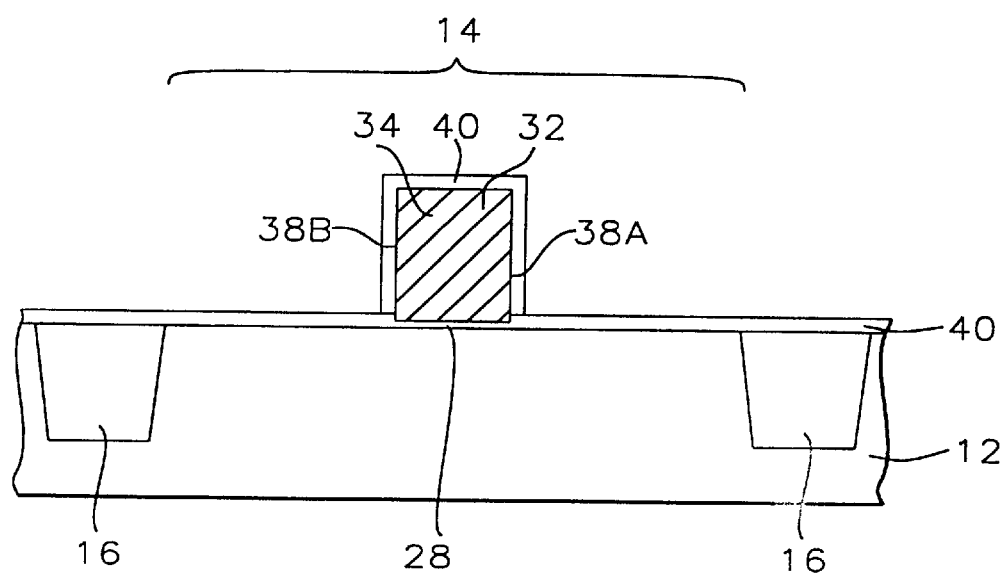

As shown in FIG. 10, an etch, preferably a short HF (hydrogen fluoride) wet etch, is used to remove hard mask oxide layer 36 and oxide sidewalls 42A, 42B from gate electrode conductor 32 and sacrificial oxide layer portions 18A, 18B from silicon layer 12 of semiconductor structure 10. This exposes upper surface 34 of gate electrode conductor 32. It is noted that the HF etch is of a shorter duration than normally would be used.

Re-oxidation of polysilicon gate electrode conductor 32 and silicon layer 12 may then be conducted to form oxide layer 40 over gate electrode conductor side walls 38A, 38B and upper surface 34 of gate electrode conductor 32 and over silicon layer 12. Oxide layer 40 has a thickness of about 30 Å.

The method of the present invention achieves the following, inter alia:

a) poly gate patterning is possible even for ultra-thin (from about 3 to 100 Å thick) gate oxide layers;

b) the plasma damage experienced by the gate oxide layer is reduced by using a second polysilicon layer 30 CMP and a shorter polysilicon etch of hard mask oxide layer 36 and sacrificial oxide layer portions 18A, 18B;

c) the risk of poly edge GOI failure due to nitride sublimation (Kooi effect) into the semiconductor structure is reduced; and d) the polysilicon gate electrode conductor profile is improved by the controlled poly plasma etch using the hard mask oxide layer over the polysilicon gate electrode conductor.

While particular embodiments of the present invention have been illustrated and described, it is not intended to limit the invention, except as defined by the following claims.

We claim:

1. A method of patterning a gate electrode, comprising the steps of:

providing a semiconductor structure, with an upper silicon layer, and having: an active area; a sacrificial silicon oxide layer overlying said semiconductor structure; a first polysilicon layer overlying said sacrificial silicon oxide layer; and a silicon nitride layer overlying said polysilicon layer;

patterning said silicon nitride, first polysilicon, and sacrificial oxide layers to form a gate conductor opening within said active area and to expose sidewalls of said polysilicon layer;

growing a gate oxide layer over the semiconductor structure within said gate conductor opening and over the exposed sidewalls of said first polysilicon layer;

depositing a second polysilicon layer over the structure, filling said gate conductor opening;

polishing said second polysilicon layer to remove the excess of said second polysilicon layer from said nitride layer, forming a polysilicon gate conductor within said gate conductor opening and over said gate oxide layer; said polysilicon gate conductor having an exposed upper surface;

oxidizing said exposed upper surface of said polysilicon gate conductor to form a hard mask oxide layer over said polysilicon gate conductor;

etching and removing said nitride layer from said first polysilicon layer;

etching and removing said first polysilicon layer from said semiconductor structure; and etching and removing said hard mask oxide layer and said gate oxide sidewalls thereby exposing the side walls of said polysilicon gate conductor.

2. The method of claim 1, including a step of cleaning said semi-conductor substrate within said gate conductor opening after said patterning step and before said gate oxide layer growth step.

3. The method of claim 1, including the following steps:

after removing said hard mask oxide layer oxidizing said exposed upper surface and sidewalls of said polysilicon gate conductor.

4. The method of claim 1, wherein said second polysilicon layer polishing step is performed by chemical-mechanical polishing.

5. The method of claim 1, wherein said sacrificial oxide layer is from about 135 to 165 Å thick; said first polysilicon layer is from about 180 to 220 Å thick; and said silicon nitride layer is from about 2070 to 2530 Å thick.

6. The method of claim 1, wherein said sacrificial oxide layer is from about 145 to 155 Å thick; said first polysilicon layer is from about 190 to 210 Å thick; and said silicon nitride layer is from about 2200 to 2400 Å thick.

7. The method of claim 1, wherein said gate oxide layer is from about 10 to 30 Å thick.

8. The method of claim 1, wherein said gate oxide layer is from about 15 to 25 Å thick.

9. The method of claim 1, wherein said second polysilicon layer is from about 3150 to 3850 Å thick.

10. The method of claim 1, wherein said second polysilicon layer is from about 3400 to 3600 Å thick.

11. The method of claim 1, wherein said hard mask oxide layer is from about 180 to 550 Å thick.

12. The method of claim 1, wherein said hard mask oxide layer is from about 250 to 450 Å thick.

13. The method of claim 1, wherein said hard mask oxide layer is from about 300 to 350 Å thick.

14. A method of patterning a gate electrode, comprising the steps of:

providing a semiconductor structure, with an upper silicon layer, and having: an active area; a sacrificial silicon oxide layer overlying said semiconductor structure; a first polysilicon layer overlying said sacrificial silicon oxide layer; and a silicon nitride layer overlying said polysilicon layer;

patterning said silicon nitride, first polysilicon, and sacrificial oxide layers to form a gate conductor opening within said active area;

cleaning said semiconductor structure within said gate conductor opening;

growing a gate oxide layer over the semiconductor structure within said gate conductor opening and over the exposed side walls of said first polysilicon layer;

depositing a second polysilicon layer over the structure, filling said gate conductor opening;

polishing said second polysilicon layer to remove the excess of said second polysilicon layer from said nitride layer, forming a polysilicon gate conductor within said gate conductor opening and over said gate oxide layer; said polysilicon gate conductor having an exposed upper surface;

oxidizing said exposed upper surface of said polysilicon gate conductor to form an hard mask oxide layer over said polysilicon gate conductor;

etching and removing said nitride layer from said first polysilicon layer;

etching and removing said first polysilicon layer from said semiconductor structure; and etching and removing said gate oxide sidewalls thereby exposing the side walls of said polysilicon gate conductor.

15. The method of claim 14, including the following steps:

etching and removing said hard mask oxide layer from said polysilicon gate conductor to expose said upper surface of said polysilicon gate conductor; and after removing said hard mask oxide layer oxidizing said exposed upper surface and side walls of said polysilicon gate conductor.

16. The method of claim 14, wherein said second polysilicon layer polishing step is performed by chemical-mechanical polishing.

17. The method of claim 14, wherein said sacrificial oxide layer is from about 135 to 165 Å thick; said first polysilicon layer is from about 180 to 220 Å thick; and said silicon nitride layer is from about 2070 to 2530 Å thick.

18. The method of claim 14, wherein said sacrificial oxide layer is from about 145 to 155 Å thick; said first polysilicon layer is from about 190 to 210 Å thick; and said silicon nitride layer is from about 2200 to 2400 Å thick.

19. The method of claim 14, wherein said gate oxide layer is from about 10 to 30 Å thick.

20. The method of claim 14, wherein said gate oxide layer is from about 15 to 25 Å thick.

21. The method of claim 14, wherein said second polysilicon layer is from about 3150 to 3850 Å thick.

22. The method of claim 14, wherein said second polysilicon layer is from about 3400 to 3600 Å thick.

23. The method of claim 14, wherein said hard mask oxide layer is from about 180 to 550 Å thick.

24. The method of claim 14, wherein said hard mask oxide layer is from about 250 to 450 Å thick.

25. The method of claim 14, wherein said hard mask oxide layer is from about 300 to 350 Å thick.

26. A method of patterning a gate electrode, comprising the steps of:

providing a semiconductor structure, with an upper silicon layer, and having: an active area; a sacrificial silicon oxide layer overlying said semiconductor structure; a first polysilicon layer overlying said sacrificial silicon oxide layer; and a silicon nitride layer overlying said polysilicon layer;

patterning said silicon nitride, first polysilicon, and sacrificial oxide layers to form a gate conductor opening within said active area;

cleaning said semiconductor structure within said gate conductor opening;

growing a gate oxide layer over the semiconductor structure within said gate conductor opening and over the exposed side walls of said first polysilicon layer;

depositing a second polysilicon layer over the structure, filling said gate conductor opening;

polishing said second polysilicon layer to remove the excess of said second polysilicon layer from said nitride layer, forming a polysilicon gate conductor within said gate conductor opening and over said gate oxide layer; said polysilicon gate conductor having an exposed upper surface;

oxidizing said exposed upper surface of said polysilicon gate conductor to form an hard mask oxide layer over said polysilicon gate conductor;

etching and removing said nitride layer from said first polysilicon layer;

etching and removing said first polysilicon layer from said semiconductor structure exposing the upper side walls of said polysilicon gate conductor;

etching and removing said hard mask oxide layer and said gate oxide sidewalls from said polysilicon gate conductor to expose said upper surface of said polysilicon gate conductor and the lower side walls of said polysilicon gate conductor; and after removing said hard mask oxide layer oxidizing said exposed upper surface and side walls of said polysilicon gate conductor.

27. The method of claim 26, wherein said second polysilicon layer polishing step is performed by chemical-mechanical polishing.

28. The method of claim 26, wherein said sacrificial oxide layer is from about 135 to 165 Å thick; said first polysilicon layer is from about 180 to 220 Å thick; said silicon nitride layer is from about 2070 to 2530 Å thick; said second polysilicon layer is from about 3150 to 3850 Å thick; and said gate oxide layer is from about 10 to 30 Å thick.

29. The method of claim 26, wherein said sacrificial oxide layer is from about 145 to 155 Å thick; said first polysilicon layer is from about 190 to 210 Å thick; said silicon nitride layer is from about 2200 to 2400 Å thick; said second polysilicon layer is from about 3400 to 3600 Å thick; and said gate oxide layer is from about 15 to 25 Å thick.

30. The method of claim 26, wherein said hard mask oxide layer is from about 180 to 550 Å thick.

31. The method of claim 26, wherein said hard mask oxide layer is from about 250 to 450 Å thick.

32. The method of claim 26, wherein said hard mask oxide layer is from about 300 to 350 Å thick.

* * * * *